United States Patent
Blonder

(10) Patent No.: US 10,946,599 B2
(45) Date of Patent: Mar. 16, 2021

(54) METHOD RELATING TO PHASE CHANGE COMPOSITE BIMORPHS

(71) Applicant: GENUINE IDEAS LLC, Brookline, MA (US)

(72) Inventor: Greg E. Blonder, Brookline, MA (US)

(73) Assignee: GENUINE IDEAS LLC, Brookline, MA (US)

( * ) Notice: Subject to any disclaimer, the term of this patent is extended or adjusted under 35 U.S.C. 154(b) by 211 days.

(21) Appl. No.: 16/373,217

(22) Filed: Apr. 2, 2019

(65) Prior Publication Data

US 2019/0224931 A1 Jul. 25, 2019

Related U.S. Application Data

(62) Division of application No. 15/663,334, filed on Jul. 28, 2017, now Pat. No. 10,300,669.

(Continued)

(51) Int. Cl.
*B29C 70/68* (2006.01)
*B29C 70/88* (2006.01)
(Continued)

(52) U.S. Cl.
CPC .......... *B29C 70/682* (2013.01); *B01D 69/141* (2013.01); *B29C 70/62* (2013.01); *B29C 70/88* (2013.01); *B32B 3/085* (2013.01); *B32B 7/022* (2019.01); *B32B 7/027* (2019.01); *B32B 27/08* (2013.01); *B32B 27/20* (2013.01);
(Continued)

(58) Field of Classification Search
CPC ....... B29C 70/682; B29C 70/62; B29C 70/88; B32B 7/022; B32B 7/027; B32B 27/08; B32B 27/20; B32B 27/283; B32B 27/32; B32B 27/36; B32B 27/38; B32B 27/144; B32B 27/00; F03G 7/06–065

See application file for complete search history.

(56) References Cited

U.S. PATENT DOCUMENTS 6,004,662 A * 12/1999 Buckley .................. B32B 25/12
428/304.4
6,966,812 B1 11/2005 Blonder
(Continued)

FOREIGN PATENT DOCUMENTS

JP 2000211013 8/2000
WO WO2016037952 3/2016

OTHER PUBLICATIONS

"Bilayer." Merriam-Webster.com Dictionary, Merriam-Webster, https://www.merriam-webster.com/dictionary/bilayer. Accessed Dec. 9, 2020. (Year: 2020).*

(Continued)

*Primary Examiner* — Michael M Dollinger
*Assistant Examiner* — Christina H. W. Rosebach
(74) *Attorney, Agent, or Firm* — Lowenstein Sandler LLP

(57) ABSTRACT

A method bilayer composite thin-film beam structure is described. The structure incorporates a bulk phase change material as small inclusions in one layer of a bimorph. The structure, also referred to as a "phase change composite bimorph" or "PCBM", curls abruptly, and reversibly, at a phase transition temperature. Large curling and effective expansion coefficients are demonstrated. The PCBMs may be employed in various self-assembly mechanisms and actuators.

11 Claims, 11 Drawing Sheets

Related U.S. Application Data

(60) Provisional application No. 62/377,277, filed on Aug. 19, 2016.

(51) Int. Cl.

| | | |
|---|---|---|
| *B32B 37/14* | (2006.01) | |
| *B29C 70/62* | (2006.01) | |
| *B32B 27/08* | (2006.01) | |
| *B32B 27/20* | (2006.01) | |
| *B32B 27/28* | (2006.01) | |
| *B32B 27/32* | (2006.01) | |
| *B32B 27/36* | (2006.01) | |
| *B32B 27/38* | (2006.01) | |
| *B32B 3/08* | (2006.01) | |
| *B32B 7/022* | (2019.01) | |
| *B32B 7/027* | (2019.01) | |
| *B01D 69/14* | (2006.01) | |
| *F03G 7/06* | (2006.01) | |
| *B32B 27/00* | (2006.01) | |
| *B81B 3/00* | (2006.01) | |

(52) U.S. Cl.
CPC ............ *B32B 27/283* (2013.01); *B32B 27/32* (2013.01); *B32B 27/36* (2013.01); *B32B 27/38* (2013.01); *B32B 37/144* (2013.01); *F03G 7/06* (2013.01); *B32B 27/00* (2013.01); *B32B 2264/025* (2013.01); *B32B 2264/0214* (2013.01); *B32B 2307/732* (2013.01); *B32B 2605/00* (2013.01); *B81B 3/0024* (2013.01)

(56) References Cited

U.S. PATENT DOCUMENTS

| | | | |
|---|---|---|---|
| 8,991,026 B2 | 3/2015 | Blonder | |
| 2005/0284588 A1 | 12/2005 | Blonder | |
| 2011/0199177 A1* | 8/2011 | Lehto | B81B 3/0024 337/306 |
| 2017/0023406 A1 | 1/2017 | Kaufman et al. | |
| 2017/0234306 A1* | 8/2017 | Vanden Aker | F03G 7/065 60/529 |

OTHER PUBLICATIONS

Zhi Chen, Guiyin Fang. Preparation and heat transfer characteristics of microencapsulated phase change material slurry: A review. Renewable and Sustainable Energy Reviews 15 (2011) 4624-4632 (Year: 2011).*

Ebnesajjad "Plastic Films In Food Packaging", Materials, Technology, and Applications PDL Handbook Series, Dec. 2012, 5 pages.

Mondal, "Phase Change Materials For Smart Textiles—An Overview", Applied Thermal Engineering, Feb. 11, 2007, pp. 1536-1550.

Liu et al, "Review of Progress in Shape-Memory Polymers", Journal of Materials Chemistry, Nov. 2006, 16 pages.

Liu et al., "Giant-Amplitude, High-Work Density Microactuators with Phase Transition Activated Nanolayer Bimorphs", Nano Letters, Sep. 12, 2012, 14 pages.

Zalba et al., "Review on Thermal Energy Storage with Phase Change: Materials, Heat Transfer Analysis and Applications", Applied Thermal Engineering, Oct. 11, 2002, 33 pages.

"Plastic Films in Food Packaging" Plastic Design Library, 2012, 1 page.

Butler et al, "3 PE-Based Multilayer Film Structures", Ebnesajjad, Inc., 2013, 32 pages.

Pezzulla et al., "Geometry and Mechanics of Thin Growing Bilayers", Soft Matter, 2016, 8 pages.

Ohm et al., Liquid Crystalline Elastomers as Actuators and Sensors, Advanced Materials, 2010, 22 pages.

Turner, "Thermal-Expansion Stresses in Reinforced Plastics", U.S. Department of Commerce National Bureau of Standards, Research Paper RP1745, vol. 37, Oct. 1946, 12 pages.

Timoshenko, "Analysis of Bi-Metal Thermostats", Bi-Metal Thermostats, Sep. 1925, 23 pages.

Jamekhorshid, "A Review of Microencapsulation Methods of Phase Change Materials (PCMs) as a Thermal Energy Storage (TES) Medium" Renewable and Sustainable Energy Reviews 31, 2014, 12 pages.

Eshelby, The Determination of the Elastic Field of an Ellipsoidal Inclusion, and Related Problems, Proceedings of the Royal Society of London, Series A, Mathematical and Physical Sciences, vol. 241, No. 1226, Aug. 20, 1957, 22 pages.

Blonder, "Non-Linear Temperature-Dependent Curvature of a Phase Change Composite Bimorph Beam", CrossMark, Feb. 21, 2017, 9 pages.

Blonder, "Coffee Bags and Instinctive Active Materials: The Path to Ubiquity" Jun. 12, 2017, 4 pages.

Black et al., Historical Perspectives in Frost Heave Research, The Early Works of S. Taber and G. Beskow, Dec. 1991, 167 pages.

Xiong et al., "Facile Synthesis of PEG Based Shape-Stabilized Phase Change Materials and Their Photo-Thermal Energy Conversion". Applied Thermal Engineering 91, 2015 pp. 630-637.

Hyun et al., "Emerging Applications of Phase-Change Materials (PCMs): Teaching an Old Dog New Tricks" Angew. Chem. Int. Ed. 2014, 53, pp. 3780-3795.

Pieterson et al., "Te-Free, Sb-Based Phase-Change Materials For High-Speed Rewritable Optical Recording" Applied Physics Letters vol. 83 No. 7, 2003 pp. 1373-1375.

Machine translation of JP 2000-211013 by Motoda et al. (Year: 2000).

* cited by examiner

PCBM Temperature Threshold

PCBM Structure

Example Types of PCBM

Optical Image PCM Powder

PCM Agglomorate

SEM Empty PCM in Epoxy

PCBM-based insulation

Insulations THICKENS when COLD

Insulation COMPACTS when HOT

METHOD RELATING TO PHASE CHANGE COMPOSITE BIMORPHS

CROSS-REFERENCE TO RELATED APPLICATIONS

This application is a divisional of U.S. patent application Ser. No. 15/663,334, filed Jul. 28, 2017, titled "Phase Change Composite Bimorphs", which in turn claims the benefit of U.S. Provisional Patent Application No. 62/377,277, filed Aug. 19, 2016, titled "Phase Change Composite Bimorphs". The entireties of U.S. patent application Ser. No. 15/663,334 and U.S. Provisional Patent Application No. 62/377,277 are hereby incorporated by reference herein.

BACKGROUND

Bimorph mechanical structures are employed in various conventional applications. For example, coiled bimetallic strips act as an actuator in conventional thermostats. In another example, thermostatic faucets are employed to prevent scalding. In a further example, nichrome wire-wrapped bimetallic strips are used in automobile flashers that "blink" to signal a turn. Although bimorph mechanical structures exhibit a low intrinsic temperature sensitivity, a large enough temperature difference and a high enough aspect ratio may result in large bending motions.

However, there are many applications wherein a standard bimorph film is inadequate. For example, in biomedical devices, only a few degrees separate core temperature from skin temperature. Accordingly, this temperature difference may be too small to trigger a bimorph control. Additionally, since conventional bimorph mechanical structures respond to temperature in a linear manner, there are instances where low-level heat prematurely warps the bimorph, causing unintended behavior (e.g., a gap in a valve seat which causes a leak, rather than a seal).

Furthermore, bilayer films convert small differences in thermal expansion into large structural motion, at the expense of a reduction in force. In this regard, the displacement is proportional to the difference in expansion coefficient between the two layers. However, among common engineering materials (e.g., polymers and alloys), there is a relatively narrow range of available properties that provide robust materials with large intrinsic expansion coefficients.

In many cases, a bimorph structure's symmetric temperate response (negative or positive curvature below or above the "layflat" temperature) can be problematic.

For example, an "instinctive" air vent to control a hot-air damper may include a polyethylene terephthalate (PET)/polyethylene (PE) bimorph structure that acts as a flapper valve. Below a fixed temperature, the bimorph structure should lay flat, thereby sealing the vent, while opening wide at temperatures above the fixed temperature. Unfortunately, the continuous curvature with temperature makes tight sealing problematic. Thus, there is a need for a temperature-responsive bimorph structure and apparatus that activates over a narrow range of temperatures.

BRIEF DESCRIPTION OF THE DRAWINGS

The present disclosure will be understood more fully from the detailed description given below and from the accompanying drawings of various embodiments of the present disclosure, which, however, should not be taken to limit the present disclosure to the specific embodiments, but are for explanation and understanding only. Further, it should be understood that the drawings are not necessarily proportional or to scale.

Figure 1A:
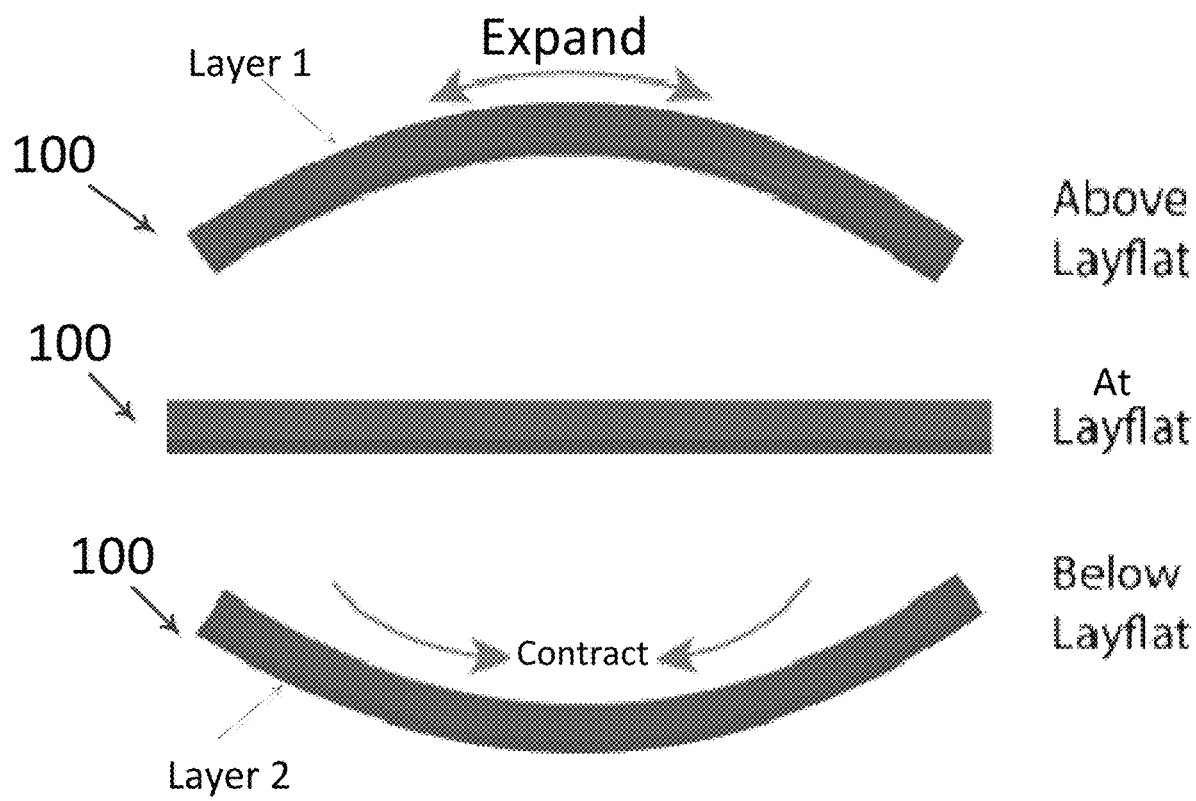
FIG. 1A illustrates an example phase change composite bimorph (PCBM), according to one or more embodiments.

While embodiments are described herein by way of example for several embodiments and illustrative drawings, those skilled in the art will recognize that the embodiments are not limited to the embodiments or drawings described. It should be understood that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION

The present disclosure is directed to a bimorph structure incorporating a phase-change material into a bilayer. In one embodiment, the bimorph structure remains thermally matched at all but a transition temperature (e.g., a phase-change temperature of the phase-change material). In one embodiment, when the bimorph structure bends, only a few degrees of temperature difference produce an increase in curvature. Advantageously, the bimorph structure of the present disclosure achieve an increase in curvature in response to a small temperature difference, as compared to a conventional bimorph that requires 5-10 times the thermal excursion to produce a curvature on that scale. In addition, the bimorph structure, according to embodiments of the present disclosure, move longer distances and with greater force than conventional elements which are dependent on small, linear thermal expansion differences in the underlying films.

According to embodiments of the present disclosure, the bilayer structure exhibits non-linear motion in response to temperature. In one embodiment, the bilayer structure, also referred to as a "phase change composite bimorph (PCBM)," the bimorph structure achieves a discrete or abrupt motion at a fixed temperature. In certain applications, such as opening or closing a valve or latching a deployable column into place, this discrete motion at a fixed temperature is desirable.

According to embodiments of the present disclosure, a bilayer composite thin-film beam structure is described. The PCBM structure incorporates a bulk phase change material as small inclusions in one layer of a bimorph. The PCBM structure is configured to curl abruptly, and reversibly, at a phase transition temperature. In one embodiment, large curling and effective expansion coefficients are demonstrated to enable the PCBMs to be may be employed in various self-assembly mechanisms and actuators.

According to embodiments of the present disclosure, the PCBM includes a first layer including a composite containing small inclusions of phase change materials. In this embodiment, when the inclusions melt, their large (generally positive and >1%) expansion coefficient induces a strong, reversible step function increase or jump in bimorph curvature. Advantageously, the measured jump amplitude and thermal response can be applied in various applications, such as in actuators and sensors. In this regard, the PCBM or non-linear bimorph "switches" state at a fixed temperature, providing improved operational control.

The present disclosure is directed to adding new capabilities to a CBM structure (e.g., a bi-metallic strip used for actuation or sensing). In one embodiment, the CBM structure includes two or more dissimilar layers, wherein temperature changes create differential strain or motion. In one embodiment, for a linear approximation to a CBM beam, curvature is proportional to the difference in thermal expansion coefficient between the two layers.

FIG. 1A illustrates an example CBM structure 100 (e.g., a film) consisting of two layers (Layer 1 and Layer 2), according to an embodiment of the present disclosure. In one embodiment, the bimorph structure 100 includes a first layer (e.g., Layer 1) comprising a high expansion film that is co-extruded with a second layer (e.g., Layer 2) comprising a low expansion material. In one example, the first layer (Layer 1) may be a high expansion plastic film that expands or contracts with temperature.

In one embodiment, the second layer (e.g., Layer 2) of the CBM film is substantially stable as it relates to changes in temperature. For example, the second layer (Layer 2) may be thin layer that is stiff and inextensible, thus forcing the first layer (Layer 1) to curl in order to accommodate the temperature induced length change. In one embodiment, this mismatch in length may produce high strains at the Layer 1/Layer 2 interface, so a tight bond is employed.

As shown in FIG. 1A, at a particular temperature referred to as the "layflat temperature" (herein "LFT"), the CBM structure 100 lays flat. As shown in FIG. 1A, both above LFT and below LFT, the CBM structure 100 curls. With reference to the bimorph bending equation for thin films with low stress, the deflection of a cantilevered beam tip "d" (or the radius of curvature "r") is:

$$d \cong \frac{\Delta\alpha\Delta T}{\delta}L^2$$

$$r \cong \frac{\delta}{2\Delta\alpha\Delta T};$$

wherein "L" is the beam length, "$\Delta\alpha$" is the difference in thermal expansion coefficient of the two layers (e.g., plastic layers), "$\Delta T$" is the temperature difference relative to the layflat temperature LFT, and "$\delta$" is the thickness of the beam.

For example, the CBM structure 100 may comprise a polyethylene (PE) film laminated to a thin sheet of polyethylene terephthalate (PET), with a $\Delta\alpha$ of 150 ppm/C, a thickness of 4 mils (0.01 cm) and a length>10 cm. When heated to a temperature of approximately 20° C. above its LFT, the bimorph structure 100 curls into ~3 cm diameter cylinder. In one embodiment, due to the low mass of the bimorph structure 100, response times are on the order of a second. In one embodiment, this response may be compared to a conventional bi-metallic strip, wherein the bimorph structure 100 exhibits a $\Delta\alpha$ of approximately 5 ppm/C and the bimorph structure 100 is thicker than the all-plastic example above, to avoid kinking, such that the curvature is 100× smaller than with an all-plastic film.

According to embodiments of the present disclosure, a relative stiffness of the layers of the bimorph structure is determined. Rearranging the terms of Timoshenko's bimetal thermostats equation, the radius of curvature can be represented as:

$$r = \frac{t_1 + t_2}{2\Delta\alpha\Delta T}[1 + \beta]$$

and the dimensionless curvature is expressed as $$\mathfrak{M} \equiv \frac{t_1 + t_2}{r} = \frac{\delta}{r} = \frac{2\Delta\alpha\Delta T}{1 + \beta}$$

wherein $\beta$ represents the Young's modulus correction to a bimorph cantilever:

$$\beta = \frac{1}{3}\frac{E_1 t_1^3 + E_2 t_2^3}{(t_1 + t_2)^2}\left(\frac{1}{E_1 t_1} + \frac{1}{E_2 t_2}\right)$$

In one embodiment, the radius is minimized (e.g., the bimorph structure achieves its most curled state) when $$\frac{E_1 t_1^2}{E_2 t_2^2} = 1$$

In one embodiment, when $E_1=E_2$, both layers should be the same thickness to maximize curling. In one embodiment, if one layer is much thinner than the other layer, the thinner layer is advantageously composed of a stiff material. For example, if $t_1$ is 0.075 mm of stainless steel (e.g., a first layer), and $t_2$ is a 10× thicker polymer (e.g., a second layer), then the second layer's $E_2$ should be 200 GPa/100=2 GPa. This is consistent with nylon or polycarbonate, but not low density PE.

Figure 2A:
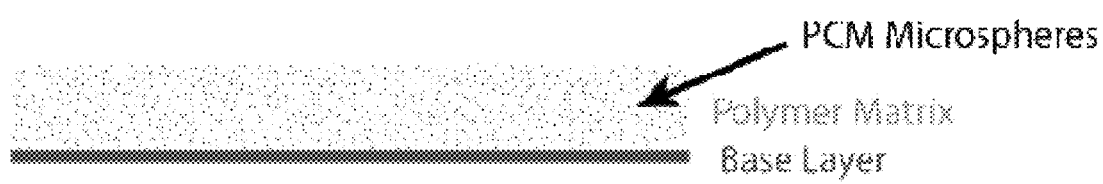
FIG. 2A illustrates an example PCBM structure, according to one or more embodiments.
Figure 2B:
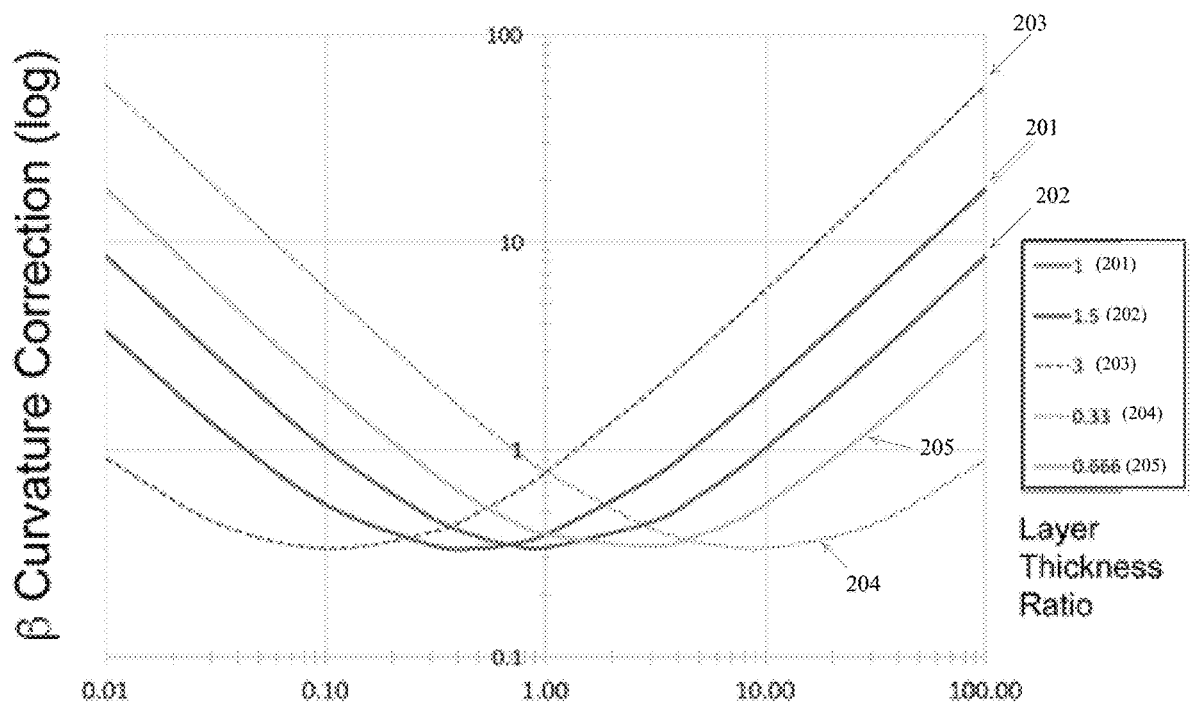
FIG. 2B is a graphical plot of a curvature correction for CBM structures of various thickness ratios, according to one or more embodiments.

FIG. 2B depicts a graph illustrating a plot of β vs the Young's Modulus ratio $E_1/E_2$, for various film layer thickness ratios $t_1/t_2$. As illustrated, the lower bound for β is $\frac{1}{3}^{rd}$. As shown in FIG. 2B, the minimum is also shallow, and has a small shift, even in view of a factor of 10 in relative modulus. According to embodiments, a stiffer material exhibits a lower expansion, so given the broad minimum, if strong curling is desired, the stiffness is reduced in exchange for a higher Δα.

Figure 1B:
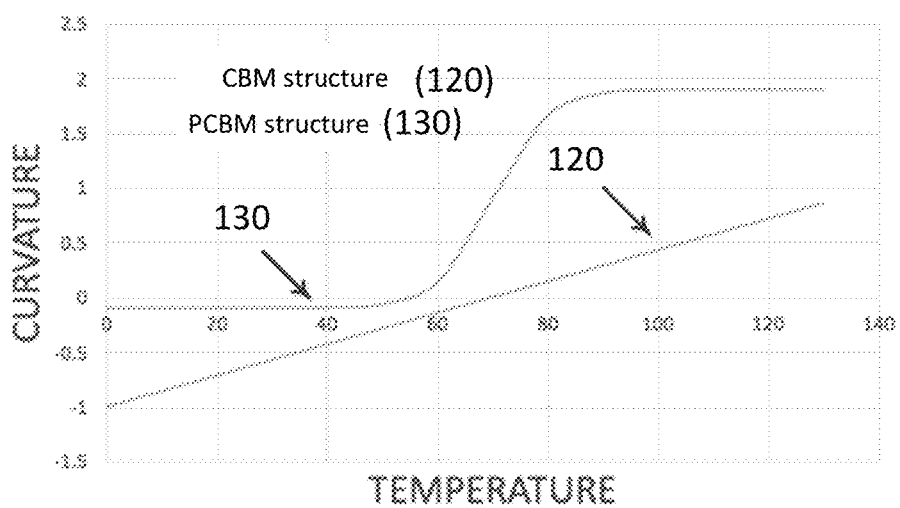
FIG. 1B illustrates a graph of bilayer curvature plotting against temperature, for a conventional bimorph (CBM).

For example, the PCBM structure may be employed as a valve flapper configured to lay flat at all temperatures below the activation temp (AT), thus sealing the vent, while opening wide at temperatures above AT, as shown by curve 130 in FIG. 1B (wherein the AT is ~70 F). FIG. 1B illustrates a comparison of the curvature of the curve 130 associated with the PCBM structure to a curve 120 associated with a standard CBM.

In an implementation, a phase transition is used to introduce a non-linear effect (i.e., instead of relying on a bulk continuous expansion coefficient). For example, the phase transition may include a melting transition from solid to liquid. In most cases, the liquid density is lower than the solid density, and this volume change can power a piston (e.g., as in a wax thermostat). Volume changes on melting can be very large (e.g., up to 15% in paraffin and 10% for steric acid). By comparison, the solid-solid phase transition in $VO_2$ produces a 1% change along the C-axis, and no bulk volume change.

In an implementation, after curing for approximately 25 hours, the PCBM is removed and tested at various temperatures. According to aspects of the present disclosure, the film remains flat below 130° F., and curls very strongly at 150° F. In an implementation, the epoxy may slightly soften at the higher temperature.

According to aspects of the present disclosure, a bimorph thin film structure is provided, where at least one film is a composite containing a phase change material (PCM). In an implementation, the PCM is in the form of small spheres. In another implementation, the PCM is in the form of small flakes.

According to embodiments of the present disclosure, a bimorph thin film structure is provided, wherein where one film layer expands non-linearly with temperature.

FIG. 2A depicts an example PCBM structure, according to embodiments of the present disclosure. In an implementation, a phase change material (PCM) is incorporated as small microspheres into a polymer matrix to form the PCBM structure. For example, by mixing approximately 10% PCM by volume, and establishing the local strains can be elastically accommodated by the surrounding plastic and a 10% volume change, as much as a 1000 ppm/C effective expansion coefficient is created.

In an implementation, the base layer, which may not contain PCMs, matches the matrix in thermal expansion coefficient. In one embodiment, this enables the PCBM structure to remain flat up to the PCM phase transition temperature. After the transition occurs, the same expansion coefficient match prevents additional curvature changes with temperature. In an implementation, the stiffness of the PCBM structure depends on the intended use, and may differ between the layers.

In one embodiment, PCM microspheres may be employed that avoid expansion coefficient stresses on the shell or matrix, by sealing a small bubble of air (along with the PCM) inside a hard plastic shell. The air buffers any expansion of the PCM on melting, thus reducing its usefulness in a PCBM. In one embodiment, the shell may be dissolved with an appropriate solvent during manufacture. For example, the methylene chloride added to many epoxies to improve plastic adhesion is effective at releasing the air bubble. This allows the PCM expansion to bear on the surrounding matrix without the moderating effect of a trapped air bubble. Alternatively, a softshell microsphere which lacks the air bubble, or a more advanced phase separation of two immiscible components (e.g. PCM and matrix) when casting the composite, may be employed, according to embodiments of the present disclosure.

In an implementation, 1 part Devcon 2 Ton clear epoxy may be blended with ½ part (by weight) of PCM microspheres (e.g., a paraffin PCM with a melting point of 56° C./135° F.). In this implementation, the PCBM structure may be cast on a 2 mil PET sheet that is sanded and coated with an adhesion promoter, then pressed in a mold to hold maintain approximately a 40 mil thick gap.

According to embodiments of the present disclosure, a bimorph structure is provided having a phase change material (PCM) incorporated into one of the layers (or films) of the multi-layer structure. In one embodiment, the layer including the PCM is referred to as the PCM layer. In one embodiment, the bimorph structure exhibits a rapid jump in curvature through the phase transition. According to embodiments, an extreme bulk volume change in a homogeneous thin film is achieved. Defining α as a fractional jump in length of the PCM layer through the transition (which plays the role of ΔαΔT in the dimensionless curvature equation recited above), it is determined that:

$$\mathfrak{M} = \frac{2\alpha}{1+\beta}$$

According to embodiments of the present disclosure, to harness the difference in volume, the liquid phase is contained, and in contact, with the surrounding matrix. In one example, PCM paraffin microspheres (µPCM) are employed. In this example, PCMs are encapsulated by a thin, melamine-formaldehyde shell. In one embodiment, the microsphere shell blocks any deleterious chemical interactions between the PCM payload and the surrounding matrix. In another example, the shell may also prevent the enclosed paraffin/hydrocarbon oil mixture from evaporating. In one example, the µPCM may be a powder. In other examples, the µPCM may be a paraffin wax/hydrocarbon PCM or employ an acrylic shell.

Figure 5A:
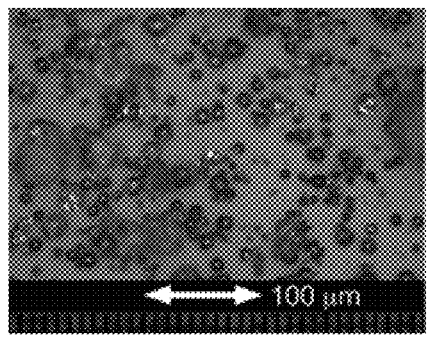
FIGS. 5A-C depict micrographs of example PCM paraffin microspheres (μPCM), according to one or more embodiments.
Figure 5B:
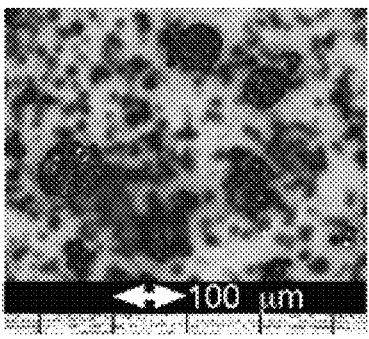
Figure 5C:
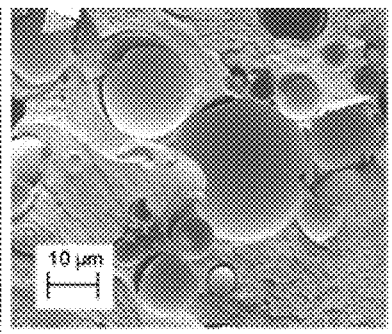

In one embodiment, the PCM microspheres may be configured to avoid expansion coefficient stresses on the shell or matrix, such as, for example, by curing the thin plastic shell around the melted, high volume PCM phase (see, e.g., FIG. 5(c), which illustrates a cross-section of µPCM in epoxy). In one example, the PCM may comprise over 85% of the total volume of the microsphere. In one embodiment, depending on shell thickness, the PCM either deflates below the melting point, or traps an air bubble inside.

According to embodiments of the present disclosure, the base layer, which may not contain PCMs, is configured to substantially match the matrix in thermal expansion coefficient. In one example, the base layer may be the same or substantially the same composition as the matrix. In one embodiment, expansion coefficient matching assures the bimorph structure remains at least substantially flat up to the PCM phase transition temperature. In one example, as measured by their Archimedes displacement in ethanol, 37° C. phase transition microspheres exhibit an expansion of approximately 9% in volume through the melting point.

Figure 3:
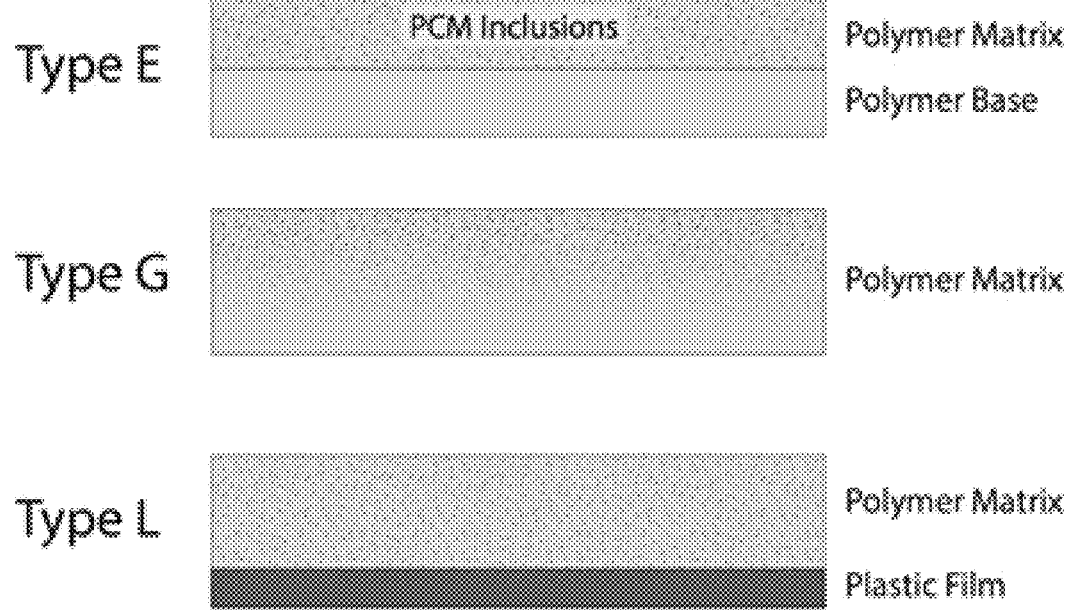
FIG. 3 illustrates example PCBM structure types, according to one or more embodiments.

In one embodiment, the μPCM is blended into a matrix as small spherical inclusions into one layer of a bimorph, as shown in FIG. 3, described in greater detail below. In one embodiment, the effective expansion coefficient for an isotropic mixture of two different materials can be approximated as:

$$\alpha_{effective} = \frac{c_1 \alpha_1 \kappa_1 + c_2 \alpha_2 \kappa_2}{c_1 \kappa_1 + c_2 \kappa_2}$$

wherein
$K_1$=bulk modulus of material 1
$c_1$=concentration material 1
$\alpha_1$=expansion coefficient material 1

According to embodiments, the jump $\acute{\alpha}$ is leveraged by the PCM concentration and relative modulus. For example, if the PCM generates a 10% volume change at the transition, with a concentration around 10%, the volume jump is approximately 1%, implying a linear expansion $\alpha_L \sim \frac{1}{3}^{rd}\%$. In one embodiment, a corresponding measured change in $\mathfrak{M}$ is approximately 0.003.

Figure 4:
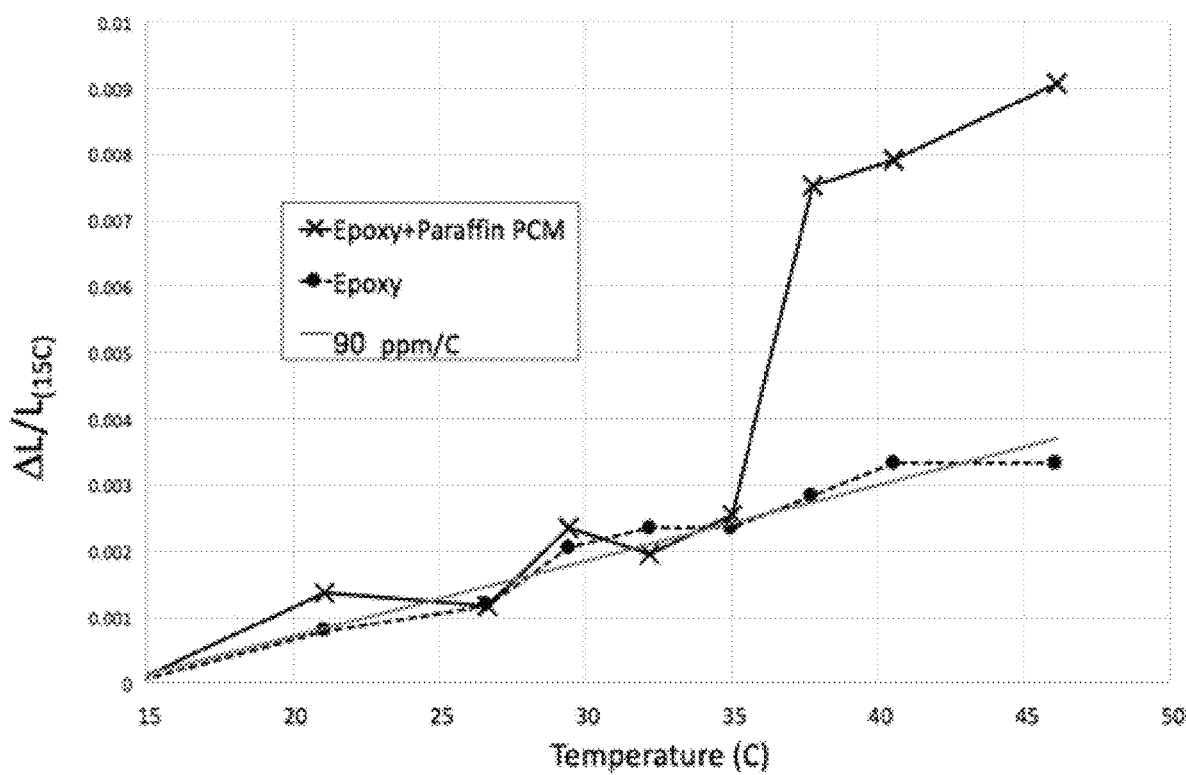
FIG. 4 is a graphical plot of the expansion of an epoxy including phase change material (PCM) inclusions, according to one or more embodiments.

In one embodiment, the μPCM is mixed into epoxy at approximately a 20 wt % level, and cast into 10 cm long rods. In one embodiment, the epoxy has a bulk linear thermal expansion coefficient of 90 ppm/C and the PCM has a phase-change transition of 37° C. As shown in FIG. 4, the rod's length abruptly rises at the 37° C. phase transition. In one embodiment, the jump in length is around 0.5%, which approximately corresponds to a 20% MCM concentration and a linear expansion of ⅓ of the 9% PCM volume expansion. Advantageously, the matrix containing PCMs acts like a single material with an abrupt expansion at a well-defined temperature.

FIG. 3 illustrates example types of PCBM, according to embodiments of the present disclosure. In one embodiment, the Type E (Epitaxial) PCBM includes two layers cured from the same polymer, wherein one layer contains a uniform distribution of μPCM. In this embodiment, since both layers are fabricated from the substantially the same polymer, differential expansion is solely a response to the temperature dependence of the embedded μPCM.

In one embodiment, as shown in FIG. 3, a Type G (Graded) PCBM is provided. In this embodiment, before the polymer matrix cures and while exhibiting a low viscosity, the μPCM inclusions either sink (or float) to one surface, depending on their specific gravity relative to the matrix. In this embodiment, since the matrix's expansion coefficient is common to the high and low PCM concentration regions, any temperature induced bending is a function of the μPCM phase transition.

As shown in FIG. 3, a Type L (Laminated) PCBM may be fabricated. In this embodiment, the Type L PCBM includes a layer of polymer uniformly filled with μPCM that is either cast on a thin plastic film, or later bonded to a separate plastic film. In this embodiment, since the expansion coefficients generally differ between the plastic and polymer, the laminated film curls in response to both the difference in film expansion coefficients, as well as the PCM transition.

According to embodiments of the present disclosure, a PCBM is constructed from a phase change material, a compatible polymer matrix, and an assembly protocol to create a bilayer structure. For example, PCBM samples may be compression molded between 1.25 cm thick flat aluminum plates. In this example, each plate may be covered with a 5 mil (0.125 mm) release sheet (e.g., either PE or PET). In this example, a parallel gap between the two release sheets is maintained by removable spacers.

According to embodiments of the present disclosure, to mold the samples, one release sheet may be placed on the bottom aluminum plate. In one embodiment, spacers (approximately 1 mm high) are arranged around the perimeter. In one embodiment, an amount of curing polymer (e.g., an epoxy with the consistency of peanut butter (30 k-100 kcP)) is placed in the approximate center. In one embodiment, a second release sheet and upper aluminum plate are arranged on top. In one embodiment, the 1.25 cm thick plate provides sufficient pressure to flatten the polymer. In one embodiment, additional weight may be applied to flatten the polymer.

In one embodiment, aluminum plates are employed to act as a thermal heat sink, reducing the chance that an exothermic cure reaction will occur and drive the PCM through its phase transition. In one embodiment, after the polymer fully cures, the compression mold is disassembled and the release sheets peeled away from the hardened polymer disk. It is noted that most epoxies have a relatively low (35-45° C.) glass temperature. In one embodiment, during the transition from glassy to elastomeric behavior, coefficients of thermal expansion may increase by approximate 3-5 times. In one embodiment, this may cause the PCBM to bend below the PCM transition temperature. In one embodiment, high glass temperature (>80° C.) epoxies are employed to encapsulate low temperature 37° C. (100° F.) microspheres. In one embodiment, the temperature gap prevents the epoxy glass transition from interfering with the operation of the PCBM.

According to embodiments of the present disclosure, μPCMs may agglomerate into much larger granules post formulation, such as approximately 10-100 times greater in diameter than the spheres themselves. In one embodiment, if these agglomerates are cast into a high surface tension matrix, the interstitial air may buffer any volume expansion. In one embodiment, agglomerates can be dissipated by at least one of vacuum de-airing the filled-uncured matrix, choosing a matrix resin that has a low surface tension with the shell, and mechanical shearing.

FIG. 5 depicts micrographs of paraffin wax microspheres, according to embodiments of the present disclosure. FIG. 5(a) illustrates an embodiment relating to a μPCM powder having individual spheres (e.g., with an average diameter of approximately 10 μm). FIG. 5(b) illustrates an embodiment relating to PCM agglomerates of spheres. FIG. 5(c) illustrates a cleaved Scanning Electron Microscopy (SEM) cross-section showing an epoxy matrix fully infiltrating the agglomerates.

According to embodiments of the present disclosure, a PCBM disk may be mounted on a stand engraved with fiducials or markings indicating the radius of curvature. In one embodiment, the stand or platform is placed in a temperature controlled air or water bath which scans the temperature over a range (e.g., 15° C. to 55° C.) over a period of times (e.g., 30 minutes). In one embodiment, the film may be aligned perpendicular to gravity to avoid potential sagging. In one embodiment, film curvature may be measured optically by analyzing still images (e.g., using a software program such as MATLAB™).

According to an embodiment of the present disclosure, a Type E (see FIG. 3) μPCM and silicone matrix structure may be fabricated. In one example, an air-drying silicone putty (e.g., Sugru®) may be employed. In one embodiment, a 20% by weight μPCM may be kneaded or otherwise combined with an amount of the air-drying silicone putty (e.g., 5 gms of Sugru®), then compression molded into a flat disk (e.g., a flat disk that is approximately 0.75 mm thick) and arranged between two sheets of PE. In one embodiment, a similar disk may be compression molded out of silicone putty (e.g., Sugru®).

In one embodiment, a sheet of PE may be peeled from each disk, and the two free, tacky surfaces laminated together under pressure between plates (e.g., plates with a 1.5 mm spacer). In one embodiment, both layers of PE are peeled away and the PCBM disk (e.g., a 6 cm diameter PCBM disk) is air dry for a period of time (e.g., 24 hours) on a fine mesh screen to encourage air-flow.

Figure 6:
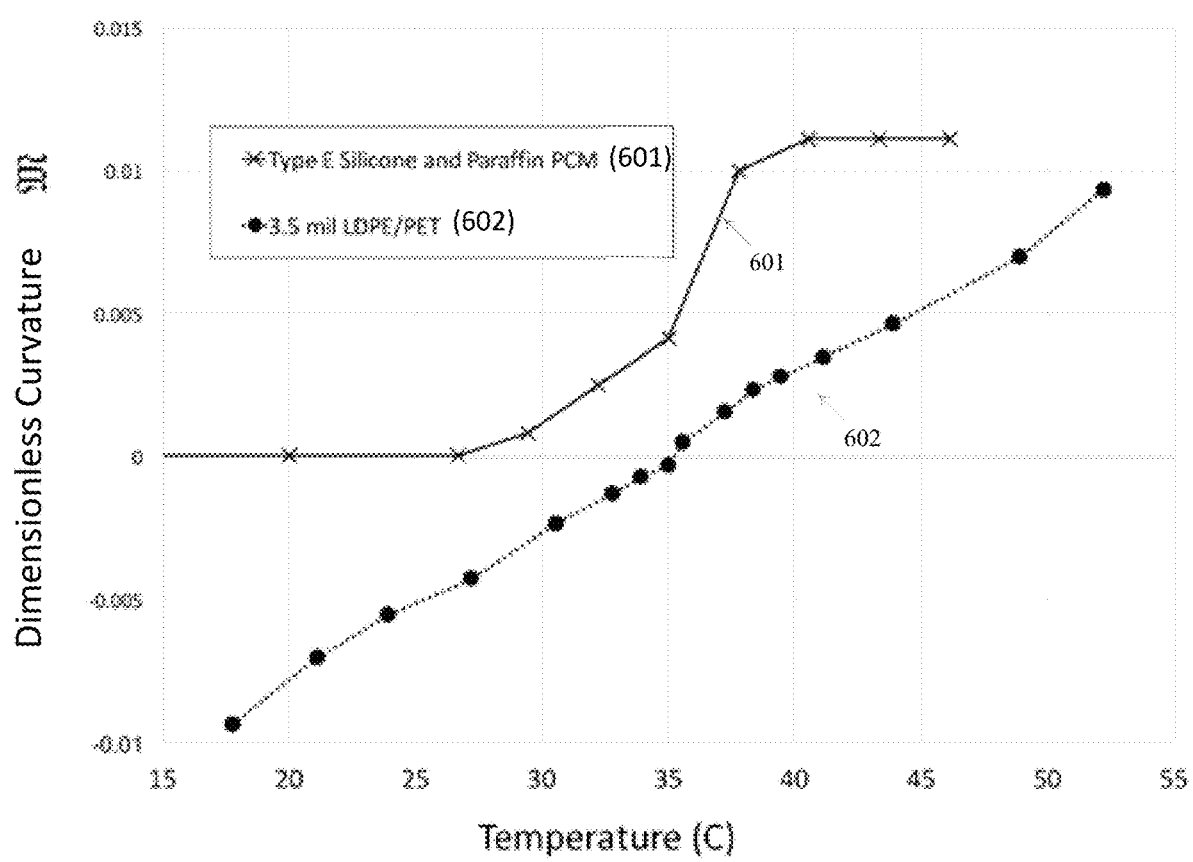
FIG. 6 is graphical depiction of the dimensionless curvature versus temperature of an example PCBM structure in comparison with an all plastic bimorph, according to one or more embodiments.

FIG. 6 illustrates a graph depicting a dimensionless curvature vs temperature for a 1.5 mm thick Type E silicone matrix/paraffin wax microsphere PCBM, compared to an all-plastic CBM structure (e.g., a 3 mil (0.075 mm) thick film of low density polyethylene laminated to 0.5 mil (0.013 mm) PET). As shown in FIG. 6, a first curve 601 corresponding to the Type E PCBM and a second curve 602 corresponding to the all-plastic CBM are compared. As illustrated, curve 601 exhibits a non-linear jump, as compared to the behavior of the "standard" thermal bilayer (e.g., the 3.5 mil (0.08 mm) thick low density polyethylene/PET structure, such as those used for packaging coffee). As shown, curve 602 exhibits a linear variation in curvature with temperature, without the jump or increase exhibited by curve 601.

As illustrated, the abrupt jump or increase near the phase transition seen in FIG. 6 is reversible without hysteresis. In one example, the transition may begin approximately 5° C. below the nominal melting point because the paraffin wax mixture itself exhibits a range of melting points.

Figure 7:
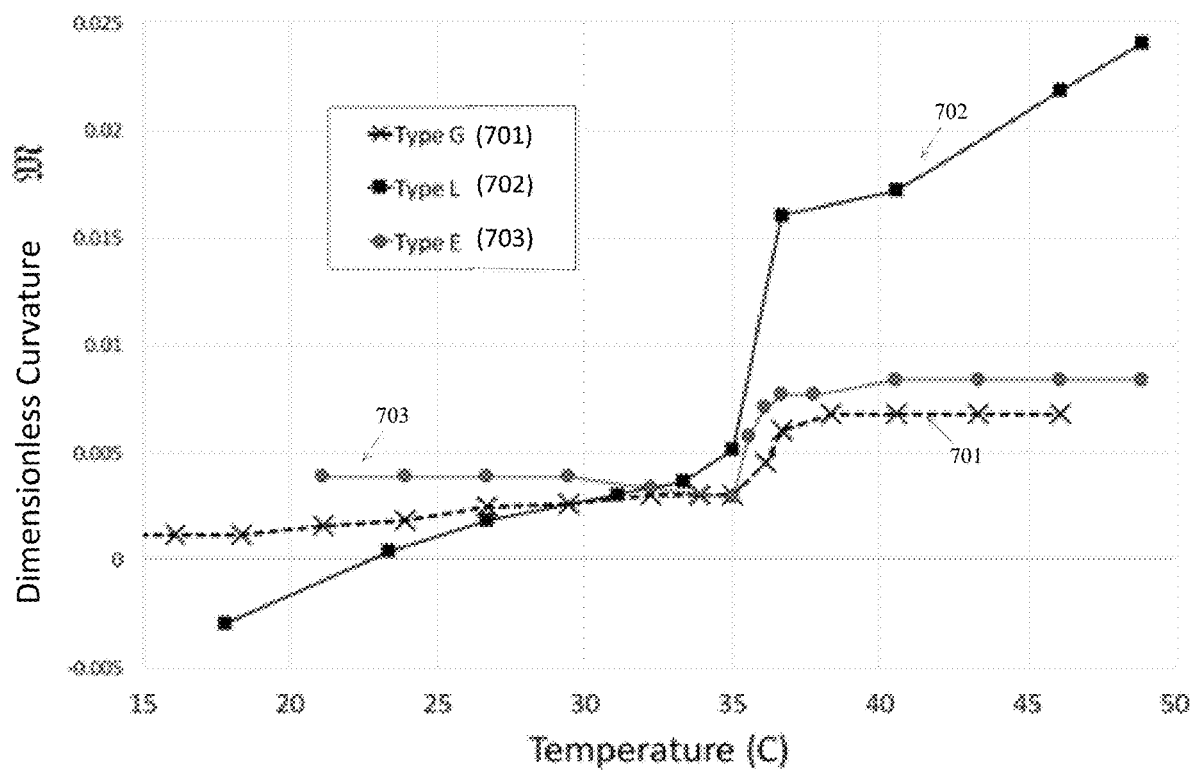
FIG. 7 is graphical depiction of the dimensionless curvature versus temperature of various types of example PCBM structures, according to one or more embodiments.

Various Type E, L. and G films may be fabricated according to embodiments of the present disclosure. For example, the Type E, L, and G PCBM structures may be between 0.5 mm and 2 mm in thickness, include epoxy as the matrix, and contain approximately 20% by weight μPCM in one layer of the bilayer structure. As illustrated in FIG. 7, the Type G and E films, despite the radical difference in structure, behaved similarly, with an approximately constant curvature, except at the 37° C. phase transition point. In one embodiment, the Type L phase change jump of 702 in FIG. 7 is superimposed on a linear background of a standard plastic bimorph.

Figure 8:
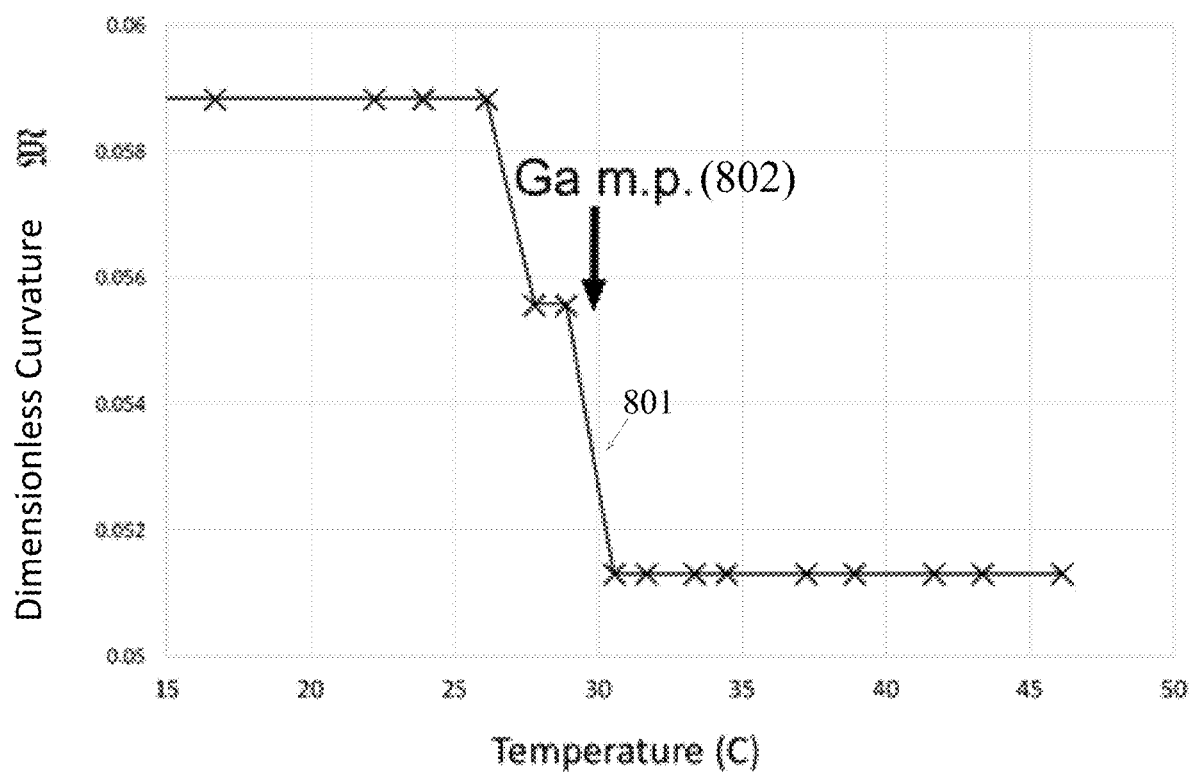
FIG. 8 is a graphical plot of the dimensionless curvature versus temperature of an example PCBM structure having gallium inclusions, according to one or more embodiments.

FIG. 8 illustrates a graph depicting a dimensionless curvature of a gallium PCBM, according to embodiments of the present disclosure. In one embodiment, the PCBM is fabricated with unencapsulated gallium inclusions (e.g., gallium inclusions in the size range of 0.5 to 50 μm with a film thickness of approximately 1.5 mm). As illustrated in FIG. 8, the curve 801 of the gallium PCBM declines as the temperature rises through the melting point 802 (denoted as "Ga m.p. 802" in FIG. 8). As detailed above, in one embodiment, the jump amplitude is represented by the following equation:

$$\mathfrak{M} = \frac{2\alpha'}{1+\beta}$$

According to embodiments of the present disclosure, the bimorph structures described herein demonstrate that by supplementing a film's uniform thermal expansion with a discontinuous jump in volume at a phase transition, various applications may be achieved (as compared to those achievable using conventional bimorphs). In one embodiment, a resin that segregates on curing into a matrix and a non-percolating PCM phase may be employed. In one embodiment, homogeneous phase change materials which undergo a solid-solid transition, and match the underlying matrix mechanical properties, may be employed. In one embodiment, combining the PCBM with mesoscopic fabrication techniques, such as embossing, lithography or laser cutting, may be performed to control the direction and extent of motion (e.g., to enhance the capabilities of the PCBM as an actuator or sensor).

A PCBM according to embodiments of the present disclosure provide an inexpensive, versatile, non-metallic solution, which does not require thermal training. A PCBM according to embodiments of the present disclosure are well suited for high volume, large area applications. In addition, the PCBMs described herein may complement shape-memory polymers, without the associated complex thermal training, and may sustain additional actuation cycles.

Figure 9:
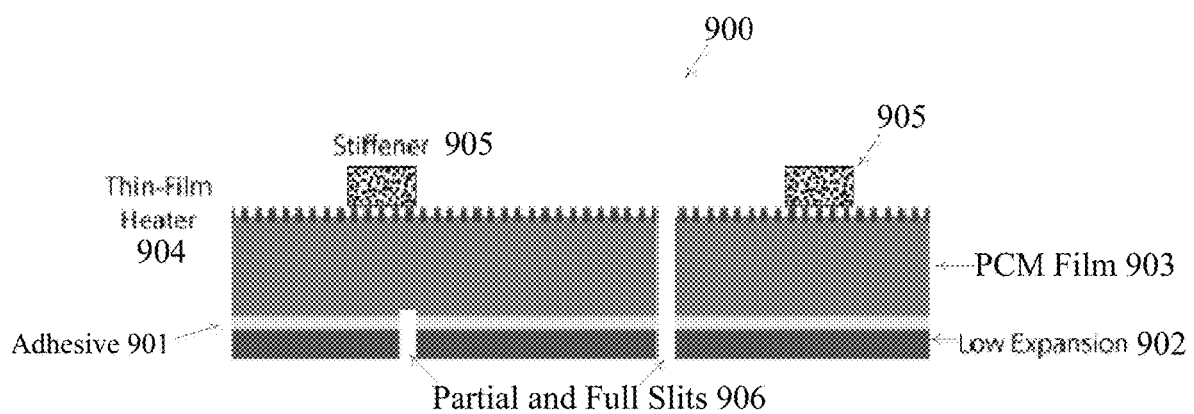
FIG. 9 depicts an example PCMB structure, according to one or more embodiments.

According to embodiments, as shown in FIG. 9, a PCBM structure 900 may include an adhesive layer 901 to bond a low expansion film 902 to a PCM containing film 903 together, along with an integrated thin-film heater layer 904 to electrically activate the structure. In one embodiment, the thin-film heater layer 904 may be disposed on the surface (as shown in FIG. 9) or buried inside the PCBM structure 900. In one embodiment, sections of the film may be partially die or laser cut to form partial or full slits 906. In one embodiment, the unprocessed lamina may be a symmetric stack (PCM-low expansion-PCM) with the PCM film selectively removed from one side, so the film can bend in either direction. In one embodiment, stiffener bars or plates 905 can be employed to guide or force the film to move along a specific axis relative to the built-in curl.

In one embodiment, the layflat temperature, along with any intrinsic curl stresses, can be adjusted via changing or adjusting one or more of the following: roller tension, curing temperatures, feed speeds, and post-processing annealing. In one embodiment, the PCBM structure curls in a direction parallel to the web motion. According to embodiments of the present disclosure, PCBM structures may have LFTs ranging from approximately 0° C. to 250° C., thicknesses from a few mils to a mm, and lifetimes of greater than 100 million cycles.

In one embodiment, the PCBM structures move in response to temperature changes (and in some cases humidity or chemical environment), a desired function can be activated by control over the PCBM structure's geometry.

In an example, a PCBM structure may be employed to sense the heat produced by high solar loads and reflect excess solar energy during the day, while allowing light to enter at other times. Alternate methods may include light shelves and electrochromic windows. In one embodiment, a large die-cut screen of slots (e.g., film 1001) is overlaid with a semi-reflective PCBM structure, and laminated to the suspended IR reflector film internal to a triple glazed window. In this example, annealing and curing temperatures during film lamination adjust the LFT to 90° F.

Figure 10A:
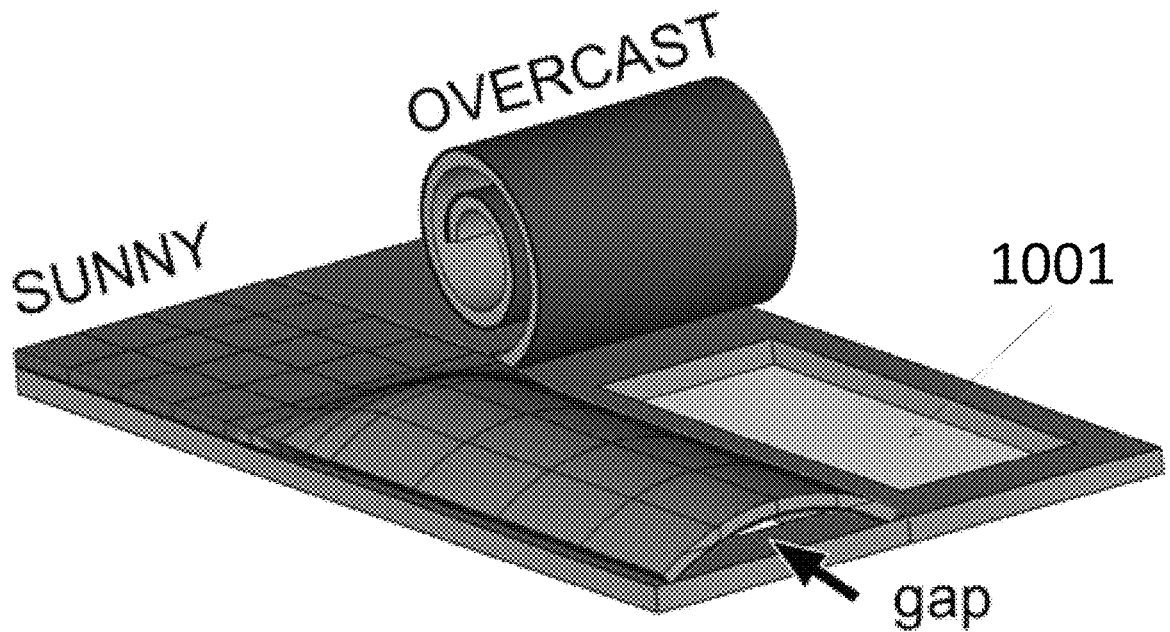
FIGS. 10A-B depict example applications including an example PCMB structure, according to one or more embodiments.

As shown in FIG. 10A, when exposed to bright sunlight, the film heats and flattens, at least partially blocking the slot. Under less intense illumination (e.g., "overcast"), the film curls in the opposite direction (due to the intrinsic built-in stress from lamination), uncovering the slot, thereby allowing light to enter.

Figure 10B:
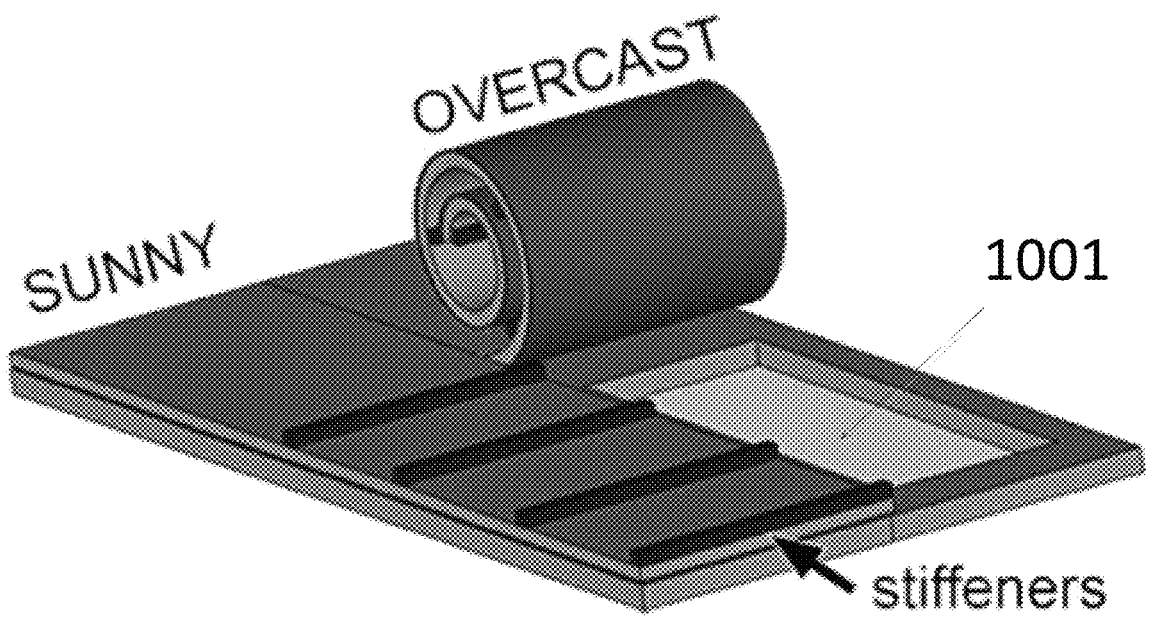

In an alternative embodiment, as shown in FIG. 10B, stiffener bars are laminated to the light valve (e.g., using production tools that normally attach package labels and hang tabs). The stiffener bars or stiffeners prevent the flap from curling into a tight cylinder in sunny conditions, but roll-up in an overcast environment. In one embodiment, longer flaps are made possible with this approach, increasing the modulation range of the flaps to near 80%. In one embodiment, the PCBM structure in FIG. 10B may be used to control ventilation.

Figure 11:
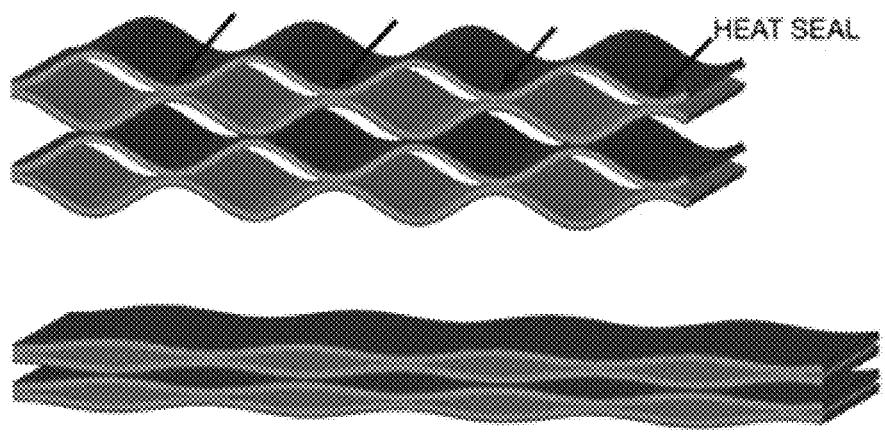
FIG. 11 depicts an example application including an example PCMB structure, according to one or more embodiments.

In another embodiment, a PCBM structure may be employed in an insulation application, as shown in FIG. 11. In this embodiment, multiple PCBM structures may be stacked and heat sealed into a quilt-like structure, such that an air-filled insulation batt is produced. The insulation batt may change thickness depending on temperature, and thus instinctively adapts its effective R value (i.e., capacity of an insulating material to resist heat flow) to the ambient conditions. For example, in a northern climate, the quilt may insulate an exterior wall on a cool day, and on a hot day, flatten and let heat escape. In this example, the PCBM-based insulation moderates temperature swings, without the need for active control.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   encapsulating at least a portion of a phase-change component in one or more microsphere shells to produce a plurality of encapsulated phase-change component inclusions;
   incorporating the plurality of encapsulated phase-change component inclusions into a matrix; and
   forming a bilayer comprising a first layer and a second layer, wherein the second layer comprises the matrix comprising the encapsulated phase-change component inclusions, and wherein a curvature of the bilayer changes in response to the encapsulated phase-change component inclusions reaching a transition temperature.

2. The method of claim 1, wherein the encapsulated phase-change component inclusions transition from a solid state to a liquid state at the transition temperature.

3. The method of claim 1, wherein the curvature of the bilayer changes due to a change in volume of the plurality of encapsulated phase-change component inclusions.

4. The method of claim 1, wherein at least a portion of the plurality of encapsulated phase-change component inclusions are encapsulated prior to incorporating into the matrix of the second layer.

5. The method of claim 1, wherein the matrix comprises a polymer.

6. The method of claim 1, wherein the phase-change component comprises gallium.

7. The method of claim 1, wherein the phase-change component transitions from a solid state to a liquid state at the transition temperature.

8. The method of claim 1, wherein the first layer comprises at least one of a polymer or a plastic.

9. The method of claim 1, wherein a first expansion coefficient of the first layer matches a second expansion coefficient of the second layer in response to a temperature above and below the transition temperature corresponding to the phase-change component.

10. The method of claim 1, further comprising compression molding the first layer and the second layer.

11. The method of claim 1, wherein the one or more microsphere shells comprise paraffin wax.

* * * * *